United States Patent [19]

Hayano et al.

[11] Patent Number: 5,237,216
[45] Date of Patent: Aug. 17, 1993

[54] HIGH-SPEED CML PUSH-PULL LOGIC CIRCUIT HAVING TEMPERATURE COMPENSATED BIASING

[75] Inventors: Shin-Ichiro Hayano; Osamu Matsuda, both of Tokyo, Japan

[73] Assignee: NEC Corporation, Tokyo, Japan

[21] Appl. No.: 874,836

[22] Filed: Apr. 28, 1992

[30] Foreign Application Priority Data

Apr. 30, 1991 [JP] Japan ................. 3-128502

[51] Int. Cl.⁵ ......................................... H03K 19/003
[52] U.S. Cl. ..................................... 307/455; 307/443; 307/446; 307/310
[58] Field of Search ............... 307/443, 446, 455, 475, 307/310, 246, 296.1

[56] References Cited

U.S. PATENT DOCUMENTS

| | | | |
|---|---|---|---|
| 4,680,480 | 7/1987 | Hopta | 307/455 |
| 4,835,420 | 5/1989 | Rosky | 307/475 |
| 4,855,622 | 8/1989 | Johnson | 307/443 X |
| 4,874,970 | 10/1989 | Coy et al. | 307/475 |
| 5,047,670 | 9/1991 | Tran | 307/475 |
| 5,066,876 | 11/1991 | Fukuda et al. | 307/455 X |
| 5,101,124 | 3/1992 | Estrada | 307/443 X |
| 5,124,581 | 6/1992 | Umeki | 307/455 X |

FOREIGN PATENT DOCUMENTS

| | | |
|---|---|---|
| 0432577 | 5/1990 | European Pat. Off. |
| 0423940 | 7/1990 | European Pat. Off. |
| 0463890 | 11/1991 | European Pat. Off. |
| 264143 | 3/1988 | France |

OTHER PUBLICATIONS

Chuang et al, A 23-ps/2.1-mW ECL Gate With An AC-Coupled Active Pull-Down Emitter-Follower Stage, IEEE Journal of Solid-State Circuits, vol. 24, No. 5, Oct. 1989, pp. 1301-1306.

*Primary Examiner*—David R. Hudspeth
*Attorney, Agent, or Firm*—Leydig, Voit & Mayer

[57] ABSTRACT

A negative-phase output signal in an ECL circuit is extracted by an emitter-follower circuit, and the extracted signal is differentiated at its leading edge by a capacitor driven by the emitter-follower circuit so as to form a pulse wave, thus the differentiated signal drives a transistor connected in parallel with an emitter-follower resistor to which a positive-phase output signal is supplied. With this operation, a large amount of current flows only at the trailing edge of the output signal to shorten the fall time of the output from the logic circuit.

6 Claims, 3 Drawing Sheets

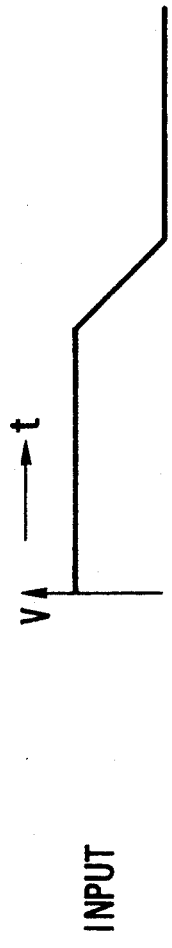
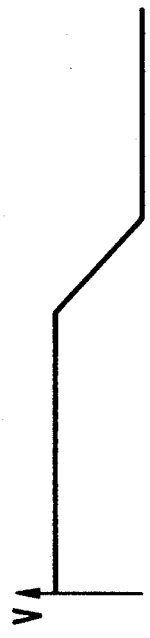
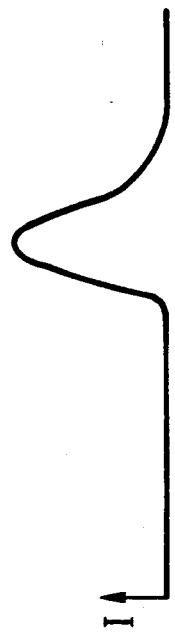
FIG. 3A  INPUT
FIG. 3B  COLLECTOR VOLTAGE OF TRANSISTOR 112, 212
FIG. 3C  COLLECTOR VOLTAGE OF TRANSISTOR 111, 211
FIG. 3D  BASE VOLTAGE OF TRANSISTOR 116, 216
FIG. 3E  EMITTER CURRENT OF TRANSISTOR 116, 216

HIGH-SPEED CML PUSH-PULL LOGIC CIRCUIT HAVING TEMPERATURE COMPENSATED BIASING

BACKGROUND OF THE INVENTION

The present invention relates to a logic circuit which operates at high speed even with a large load capacitance in an LSI and can be optimally designed in accordance with various required conditions, e.g., the load capacitance, the power consumption, and the size of each of the elements required to constitute a logic circuit, such as transistors, capacitors, resistors.

When an LSI is to be constituted by an ultra-high-speed logic circuit, in order to increase the speed of a conventional ECL circuit, a circuit which allows an increase in speed with a small increase in power consumption is known, as disclosed in Kai-Yap Toh et al., "A 23-ps/2.1-mW ECL Gate With an AC-Coupled Active Pull-Down Emitter-Follower Stage", IEEE Journal of Solid-State Circuits, Vol. 24, No. 5, October 1989, pp. 1301-1306. As described in this literature, such a circuit is realized by increasing a current flowing through an emitter-follower stage only when an output signal goes from high level to low level.

FIG. 2 is a circuit diagram of a conventional logic circuit. Referring to FIG. 2, the conventional logic circuit comprises: an input signal source 201; transistors 211 and 212 whose bases are respectively connected to the first and second outputs of the input signal source 201; a constant current source 202 having a first terminal connected to the emitters of the transistors 211 and 212, and a second terminal connected to a power source VEE; resistors 221 and 222 having first terminals connected to GND, and second terminals respectively connected to the collectors of the transistors 211 and 212; a transistor 215 having a collector and a base respectively connected to GND and the collector of the transistor 212; resistor 226 having a first terminal connected to the emitter of the transistor 215 and a second terminal connected to a power source VTT; a capacitor 230 having a first terminal connected to the collector of the transistor 211; a transistor 216 having a collector connected to the emitter of the transistor 215, a base connected to the second terminal of the capacitor 230, and an emitter connected to the power source VTT; a transistor 214 having a collector and a base respectively connected to GND and a reference voltage Vref; and a resistor 225 having a first terminal connected to the emitter of the transistor 214, and a second terminal connected to the power source VTT.

FIGS. 3A to 3E are timing charts showing operating states of the circuit shown in FIG. 2.

An operation of the conventional logic circuit shown in FIG. 2 will be described with reference to FIG. 3. Assume that the waveform shown in FIG. 3A, which changes from high to low, is supplied from the input power source 201 to the base of the transistor 211. In this case, the differential outputs shown in FIGS. 3B and 3C are obtained from the collectors of the transistors 212 and 211, respectively. The positive-phase output shown in FIG. 3B, obtained from the transistor 212, serves to drive an emitter-follower circuit constituted by the transistor 215 and the resistor 226.

The negative-phase output shown in FIG. 3C, obtained from the transistor 211, is differentiated by the capacitor 230 to be formed into a waveform having a peak at the trailing edge of the input waveform, as shown in FIG. 3D, thus driving the transistor 216 for a period of time corresponding to a given time constant. Consequently, as shown in FIG. 3E, a current having a peak at the trailing edge of the output flows through the emitter of the transistor 216 to cause a load capacitance 240 to quickly discharge.

Additionally, when the bias voltage Vref, that is applied to an emitter-follower circuit constituted by the transistor 214 and the resistor 225, determines a bias current flowing through the emitter of the transistor 216. By adjusting the bias voltage Vref, the amount of current to be discharged through the transistor 216 is determined.

In this manner, the logic circuit shown in FIG. 2 operates as a buffer for directly transferring an input logic signal.

In an ECL (emitter-coupled logic) circuit whose output stage is constituted by only an emitter-follower circuit, the discharge of the load capacitance 240 at the trailing edge of the output is performed through only the resistor 226. For this reason, if the resistance of the resistor 226 is increased to reduce the power consumption, the delay at the trailing edge of the output is increased. However, by using the circuit shown in FIG. 2, the delay can be reduced without increasing the power consumption.

In the above-described conventional logic circuit, the delay can be reduced at the trailing edge of the output. However, since the differentiating capacitor 230 is directly connected to the collector of the transistor 211 constituting a current switch, the delay of the current switch is increased at the leading edge of the current switch output.

In addition, although the bias current of the transistor 216 is determined by the bias voltage Vref, since this bias current Ib and the bias voltage Vref have the following relationship:

$$Ib = Io\{\exp\{(qVref)/(kT)\} - 1]$$

a slight change in Vref causes a great change in the bias current Ib. This greatly changes the delay characteristics of the logic circuit.

Similarly, a temperature change causes a change in built-in base-emitter voltage Vf in the transistors 214 and 216, and consequently a great change in the bias current Ib.

Furthermore, in the conventional logic circuit, there has been no method of optimizing the driving performance with respect to a load capacitance.

SUMMARY OF THE INVENTION

It is an object of the present invention to provide a high-speed logic circuit which can reduce the delay of a current switch at the leading edge of an output.

It is another object of the present invention to provide a high-speed logic circuit which prevents a deterioration in delay characteristics due to variations in external constant voltage.

It is still another object of the present invention to provide a high-speed logic circuit which can reduce variations in delay with variations in temperature.

It is still another object of the present invention to provide a high-speed logic circuit which can easily optimize the driving performance.

In order to achieve the above objects, a high-speed logic circuit according to the present invention comprises a current switch logic circuit, a first emitter-follower circuit connected to a first output of complementary outputs of the current switch logic circuit, a second emitter-follower circuit connected to a second output of the complementary outputs of the current switch logic circuit, a capacitor having a first terminal connected to an output of the second emitter-follower circuit, a first transistor having a collector connected to an output of the first emitter-follower circuit, a base connected to a second terminal of the capacitor, and an emitter connected to a power source, a series circuit constituted by two series-connected diodes and a resistor, and a third emitter-follower circuit for buffering a voltage across two ends of a series circuit constituted by the two diodes and applying an output voltage to the base of the transistor.

BRIEF DESCRIPTION OF THE DRAWINGS

FIGS. 3A to 3E are timing charts showing operations of the logic circuits shown in FIGS. 1 and 2.

DESCRIPTION OF THE PREFERRED EMBODIMENT

An operation of a logic circuit according to the present invention will be described below with reference to the accompanying drawings.

Figure 1:
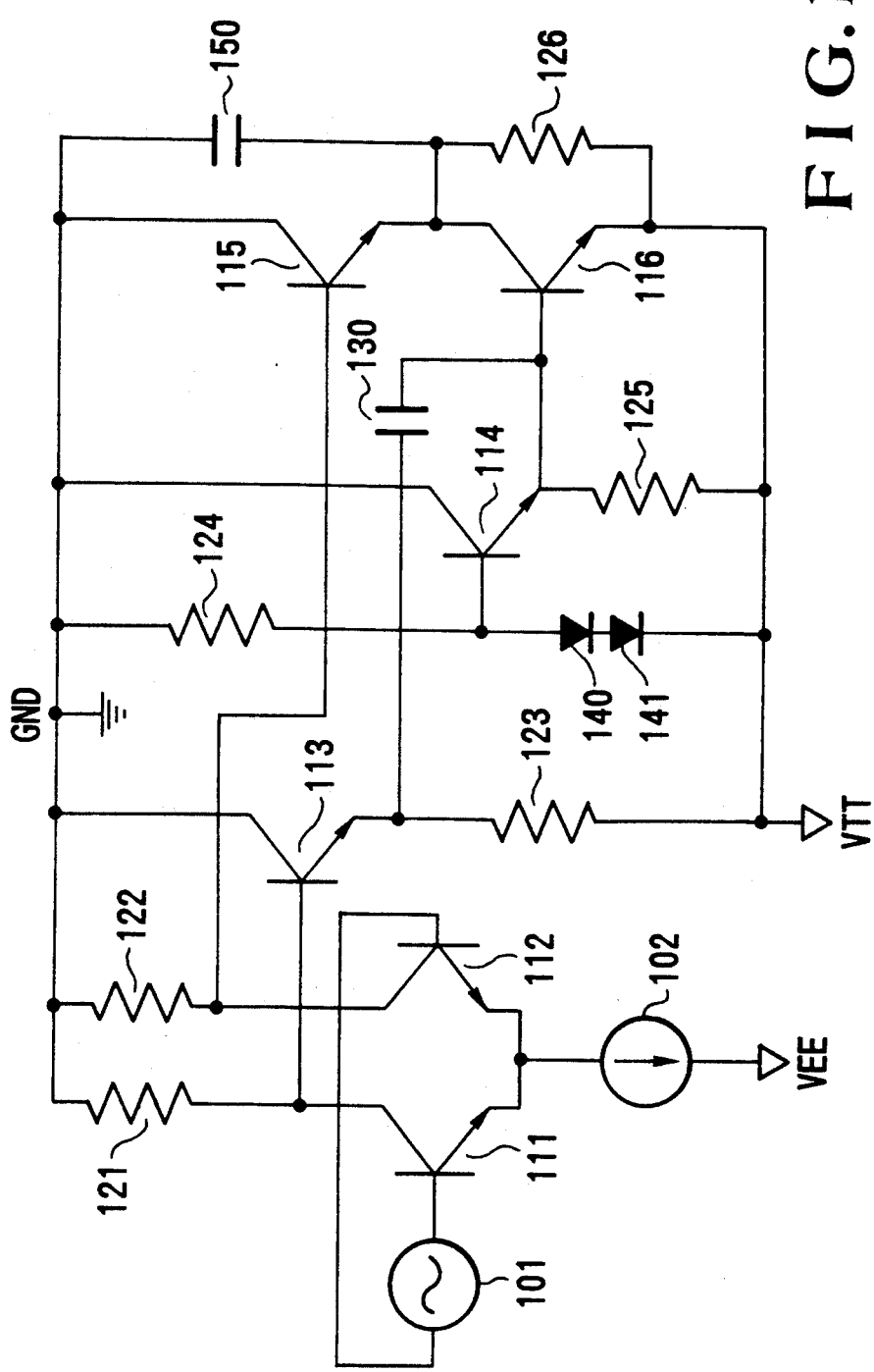
FIG. 1 is a circuit diagram showing the arrangement of an embodiment of the present invention.
Figure 2:
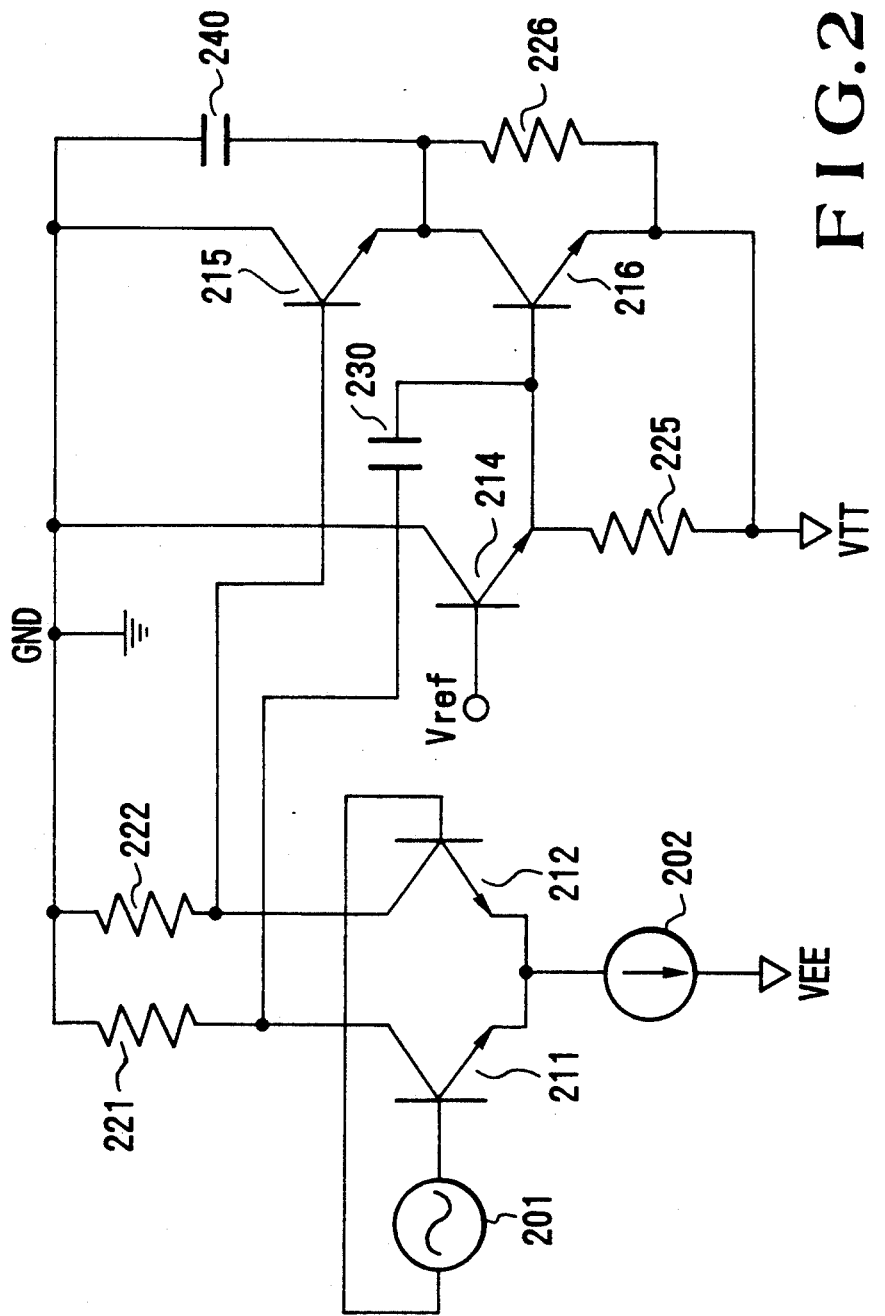
FIG. 2 is a circuit diagram showing the arrangement of a conventional logic circuit.

FIG. 1 is a circuit diagram showing an embodiment of the present invention. Referring to FIG. 1, the embodiment comprises: an input signal source 101; transistors 111 and 112 whose bases are respectively connected to the first and second outputs of the input signal source 101; a constant current source 102 having a first terminal connected to the emitters of the transistors 111 and 112, and a second terminal connected to a power source VEE; resistors 121 and 122 having first terminals connected to GND, and second terminals respectively connected to the collectors of the transistors 111 and 112; a transistor 115 having a collector and a base respectively connected to GND and the collector of the transistor 112; a resistor 126 having first and second terminals respectively connected to the emitter of the transistor 115 and a power source VTT; a transistor 113 having a collector and a base respectively connected to GND and the collector of the transistor 111; a resistor 123 having first and second terminals respectively connected to the emitter of the transistor 113 and the power source VTT; a capacitor 130 having a first terminal connected to the emitter of the transistor 113; a transistor 116 having a collector connected to the emitter of the transistor 115, a base connected to the second terminal of the capacitor 130, and an emitter connected to the power source VTT; a resistor 124 having a first terminal connected to GND; a diode 140 having an anode connected to the second terminal of the resistor 124; a diode 141 having an anode and cathode respectively connected to the cathode of the diode 140 and the power source VTT; a transistor 114 having a collector and a base respectively connected to GND and the anode of the diode 140; and a resistor 125 having first and second terminals respectively connected to the emitter of the transistor 114 and the power source VTT.

Assume that the waveform shown in FIG. 3A, which changes from high to low, is supplied from the input power source 101 in the logic circuit of this embodiment to the base of the transistor 111. Similar to the conventional logic circuit, the differential outputs shown in FIGS. 3B and 3C are obtained from the collectors of the transistors 112 and 111, respectively. The positive-phase output shown in FIG. 3B, obtained from the transistor 112, serves to drive an emitter-follower circuit constituted by the transistor 115 and the resistor 126.

The negative-phase output shown in FIG. 3C, obtained from the transistor 111, is buffered by an emitter-follower circuit constituted by the transistor 113 and the resistor 123 and is subsequently differentiated by the capacitor 130 to be formed into a waveform having a peak at the trailing edge of the input waveform, as shown in FIG. 3D, thereby driving the transistor 116 for a period of time corresponding to a given time constant. Consequently, as shown in FIG. 3E, a current having a peak at the trailing edge of the output flows through the emitter of the transistor 116 to cause a load capacitance 150 to quickly discharge.

Meanwhile, a bias voltage determined by the forward voltages of the diodes 140 and 141 is buffered by an emitter-follower circuit constituted by the transistor 114 and the resistor 125 and is applied to the base of the transistor 116, thus causing a bias current to flow through the emitter of the transistor 116.

In this logic circuit, since the differentiating capacitor 130 is not charged by an output from the transistor 111 but is charged by the emitter-follower circuit constituted by the transistor 113 and the resistor 123, the load connected to the collector of the transistor 111 is small. Therefore, the capacitance of the differentiating capacitor 130 can be increased without decreasing the operating speed of a current switch constituted by the transistors 111 and 112. Consequently, a large load capacitance can be driven by the transistor 116.

Although a bias current flowing through the transistor 116 is determined by the forward voltages of the transistors 114 and 116 and the diodes 140 and 141, since the temperature characteristics of the respective components can be easily adjusted inside the LSI, the bias current can be stabilized.

In this case, since the voltages required by load driving circuits other than the current switch portion require are low, two types of power sources, i.e., VEE and VTT, are used to reduce the power consumption. Instead of each of the resistors 123 to 126, a constant current source can perform the same operation as described above.

Means for optimizing the driving performance with respect to the load capacitance 150 will be described next with reference to FIG. 1. According to the first means, the load capacitance 150 can be increased in accordance with the capacitance of the differentiating capacitor 130. As the capacitance of the differentiating capacitor 130 is increased, a larger voltage is input to the base of the transistor 116, thus allowing the discharge of a larger load. In this case, if the capacitance of the differentiating capacitor is increased, the resistances of the resistors 123 and 125 are decreased to prevent the time constant from increasing excessively as compared with the operating frequency. With this operation, a voltage pulse can be generated at the base of the transistor 116 at every trailing edge of the output waveform.

According to the second means, the emitter area of the transistor 116 is increased in accordance with the value of the load capacitance 150. In this scheme, the current driving performance can be improved with respect to the same increase in base voltage of the transistor 116, thus allowing the load capacitance 150 to discharge a larger current.

According to the third means, the emitter area of the transistor 115 and the resistance of the resistor 126 are changed in accordance with the value of the load capacitance 150 to improve the driving performance of the emitter-follower circuit. This means can prevent a deterioration in delay characteristics at the leading edge of the output waveform with an increase in the load capacitance 150.

By using a combination of the above-described three types of optimization methods, a logic circuit can be optimally designed in accordance with various required conditions, e.g., the size of each of the elements, required to constitute an LSI, such as transistors, capacitors, resistors, the load capacitance, and the power consumption.

As has been described above, according to the present invention, the emitter-follower circuit is arranged between the current switch and the differentiating capacitor so that the differentiating capacitor can be driven while the driving performance is improved. Therefore, the value of the differentiating capacitor can be increased, and a larger load can be driven at high speed.

In addition, since the two series-connected diodes having the same temperature characteristics as those of Vf obtained by the transistors 214 and 126 are used as a circuit for generating the voltage Vref to cancel the temperature characteristics of Vf, a logic circuit can be provided, in which delay variations are small with respect to variations in circuit elements and temperature variations.

Furthermore, a deterioration in waveform can be minimized by performing one of the following adjusting operations in units of gates: changing the emitter area of the load capacitance discharging transistor in accordance the magnitude of a load capacitance; changing the value of the differentiating capacitor; changing the current flowing through the output emitter-follower circuit; and changing the time constant determined by the differentiating capacitor in accordance with the operating frequency of the circuit.

What is claimed is:

1. A high-speed logic circuit comprising:
   a current switch logic circuit;
   a first emitter-follower circuit connected to a first output of complementary outputs of said current switch logic circuit;
   a second emitter-follower circuit connected to a second output of the complementary outputs of said current switch logic circuit;
   a capacitor having a first terminal connected to an output of said second emitter-follower circuit;
   a first transistor having a collector connected to an output of said first emitter-follower circuit, a base connected to a second terminal of said capacitor, and an emitter connected to a power source;
   a series circuit including two series-connected diodes and a resistor; and
   a third emitter-follower circuit for buffering a voltage across two ends of a series circuit including said two diodes and applying an output voltage to the base of said transistor.

2. A circuit according to claim 1, wherein an emitter area of said first transistor is changed in accordance with a load capacitance connected to an output of said first emitter-follower circuit.

3. A circuit according to claim 1, wherein a value of said capacitor is changed in accordance with a load capacitance connected to an output of said first emitter-follower circuit.

4. A circuit according to claim 1, wherein a time constant determined by said capacitor is changed in accordance with an operating frequency.

5. A circuit according to claim 1, wherein a driving performance of said first emitter-follower circuit is changed in accordance with a load capacitance connected to an output of said first emitter-follower circuit.

6. A circuit according to claim 1, wherein each of said two diodes has the same temperature characteristics as those of said first transistor and of a second transistor constituting said third emitter-follower circuit.

* * * * *